(12) United States Patent
Gardiner et al.

(10) Patent No.: US 6,868,970 B2
(45) Date of Patent: Mar. 22, 2005

(54) STACKABLE TRAY FOR INTEGRATED CIRCUITS WITH CORNER SUPPORT ELEMENTS AND LATERAL SUPPORT ELEMENTS FORMING MATRIX TRAY CAPTURE SYSTEM

(75) Inventors: James G. Gardiner, Grapevine, TX (US); Valoris L. Forsyth, Lewisville, TX (US); Yap Kee Sin, Penang (MY)

(73) Assignee: Illinois Tool Works Inc., Glenview, IL (US)

( * ) Notice: Subject to any disclaimer, the term of this patent is extended or adjusted under 35 U.S.C. 154(b) by 121 days.

(21) Appl. No.: 10/414,617

(22) Filed: Apr. 16, 2003

(65) Prior Publication Data

US 2004/0206661 A1 Oct. 21, 2004

(51) Int. Cl.[7] .............................................. B65D 73/02
(52) U.S. Cl. ........................ 206/725; 206/509; 206/564
(58) Field of Search ................................ 206/701, 706, 206/707, 718, 722–725, 564, 565, 509, 560

(56) References Cited

U.S. PATENT DOCUMENTS

| | | |
|---|---|---|
| 4,765,471 A | 8/1988 | Murphy |
| 5,000,697 A | 3/1991 | Murphy |
| 5,080,228 A | 1/1992 | Maston, III et al. |
| 5,103,976 A | 4/1992 | Murphy |
| 5,400,904 A | 3/1995 | Maston, III et al. |
| 5,551,572 A * | 9/1996 | Nemoto ........................ 206/725 |
| 5,791,486 A * | 8/1998 | Brahmbhatt ................. 206/725 |
| 5,794,783 A * | 8/1998 | Carter ........................... 206/725 |
| 5,848,703 A * | 12/1998 | Murphy et al. ............. 206/725 |
| 6,116,427 A * | 9/2000 | Wu et al. ..................... 206/722 |
| 6,375,408 B1 * | 4/2002 | Carter ........................... 206/725 |
| 6,612,442 B2 * | 9/2003 | Soh et al. .................... 206/725 |

* cited by examiner

*Primary Examiner*—Luan K. Bui
(74) *Attorney, Agent, or Firm*—Pitney Hardin LLP

(57) ABSTRACT

A stacking tray for electrical components, such as integrated circuits, particularly those of the ball grid array (BGA type) includes an upper side and a lower side. The upper side includes corner elements of a greater height, the inner intersections of which define the periphery of the storage pockets for the electrical components. These corner elements therefore capture and support the electrical component in directions parallel to the floor of the tray. The upper side further includes lateral elements of a lesser height which extend across the periphery of the storage pocket thereby creating a ledge for capturing and supporting the electrical component in the direction perpendicular to the floor. The lower side includes lateral elements of a greater height with inner edges which abut the periphery of the storage pockets thereby capturing and supporting the electrical components in directions parallel to the floor of the tray. The lower side further includes corner elements of a lesser height which extend across the periphery of the storage pocket thereby creating an inverted ledge for capture and support the electrical component in a direction perpendicular to the floor. The corner elements are separate from and independent from the lateral elements.

13 Claims, 10 Drawing Sheets

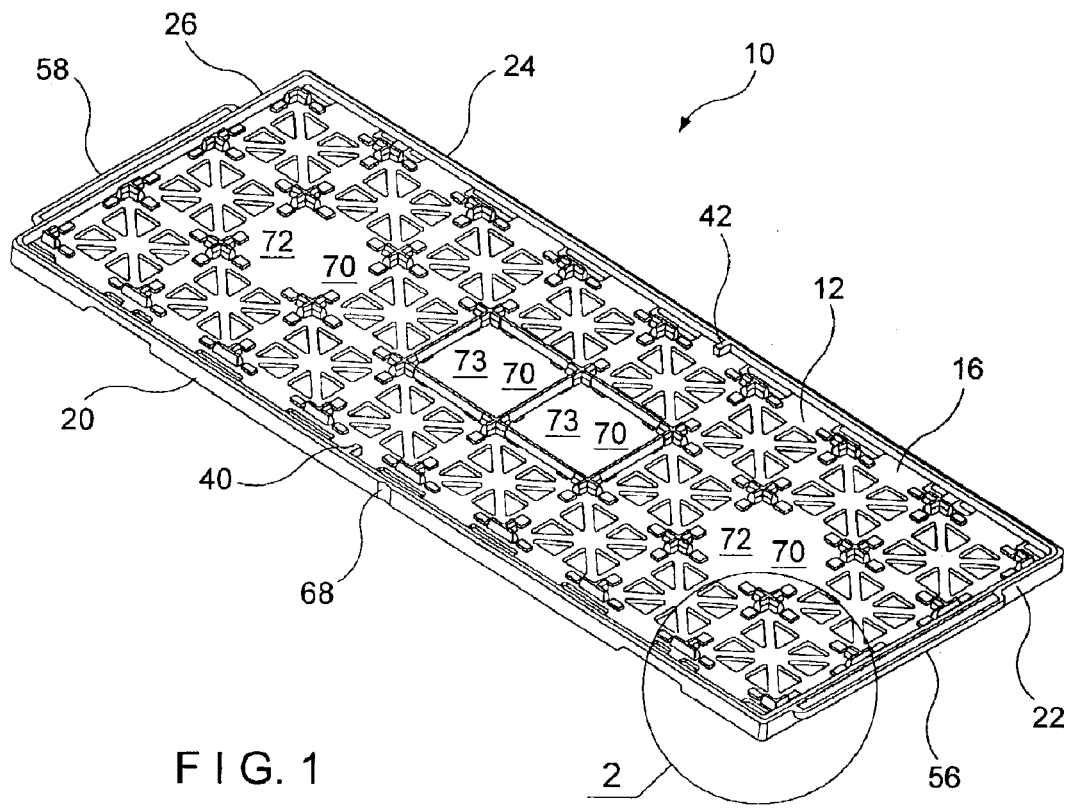
F I G. 1
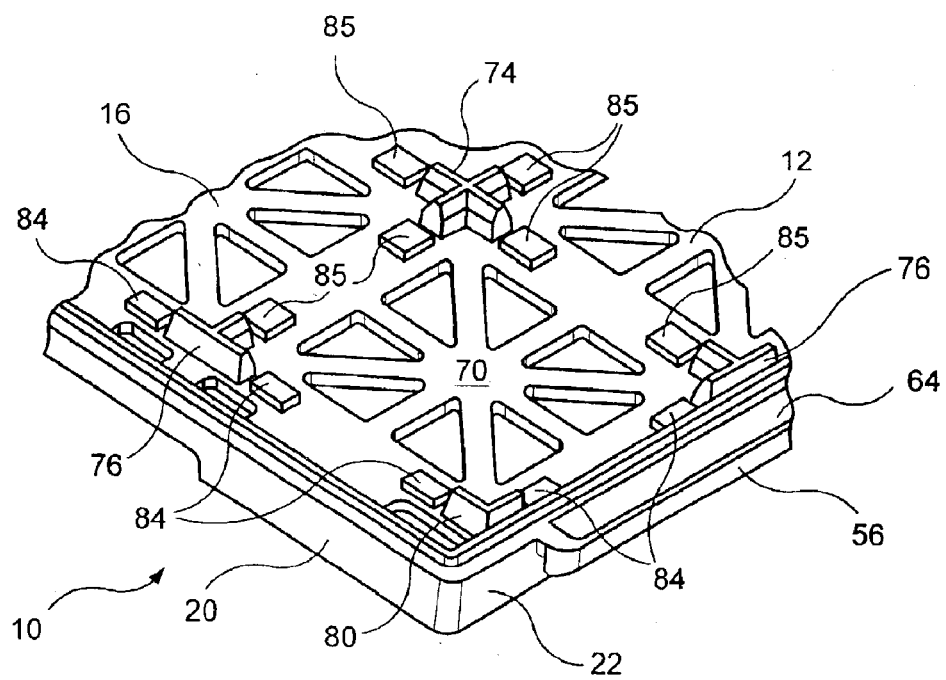
F I G. 2

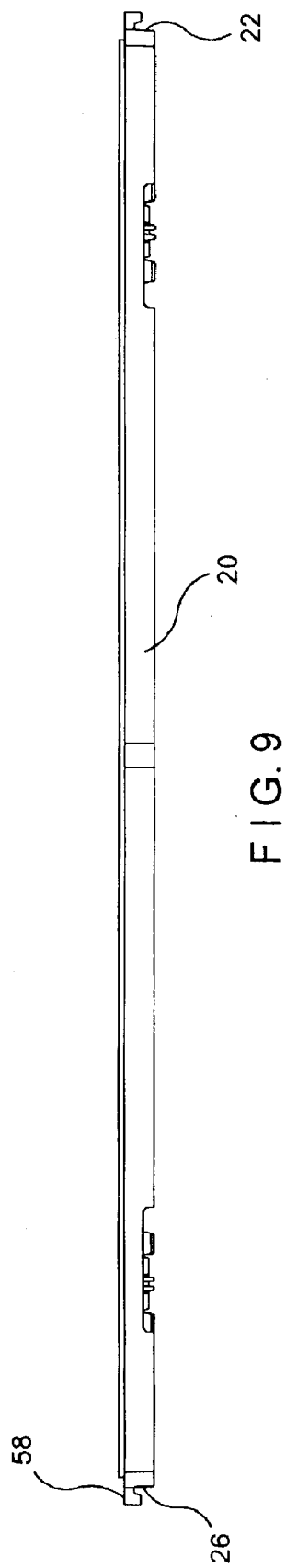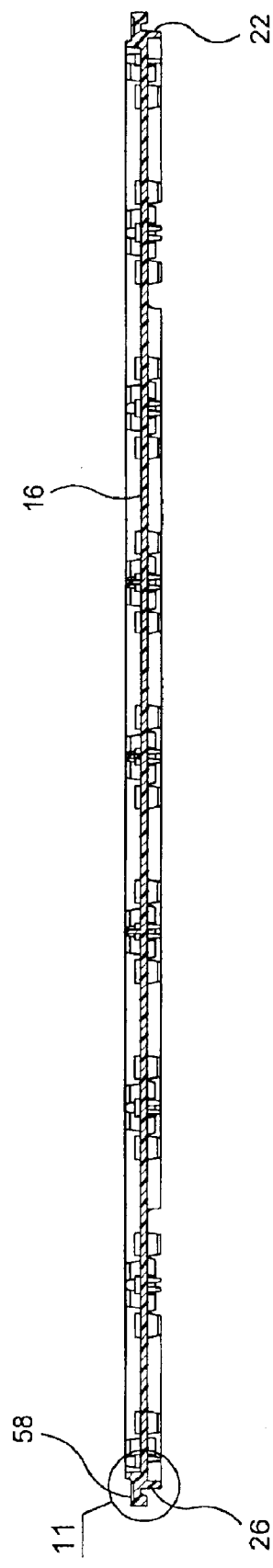

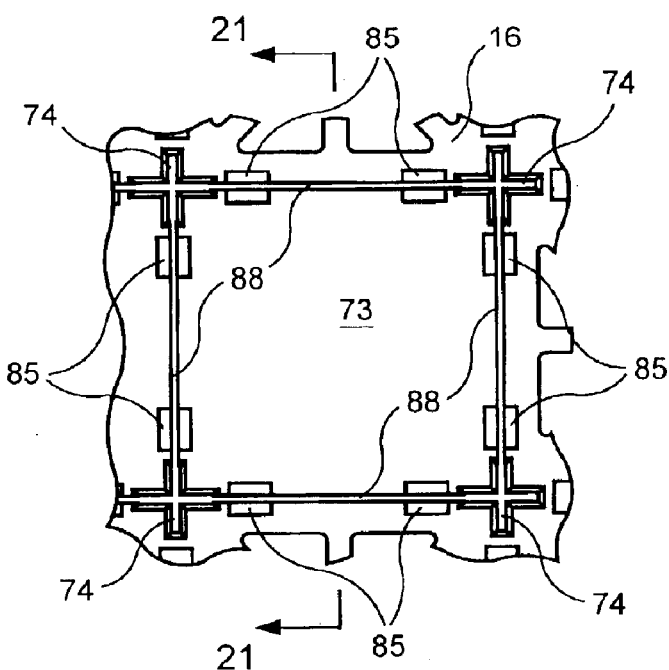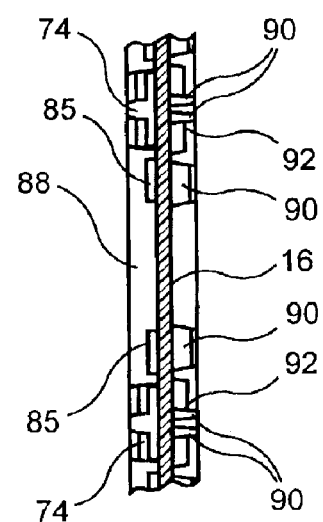
FIG. 20  FIG. 21
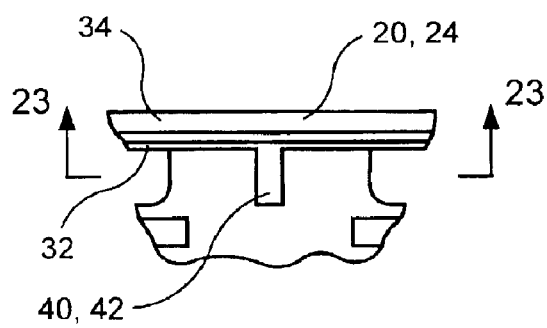
FIG. 22
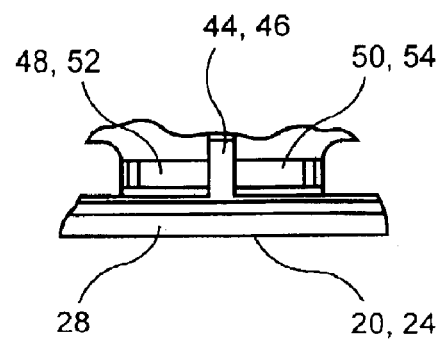
FIG. 24
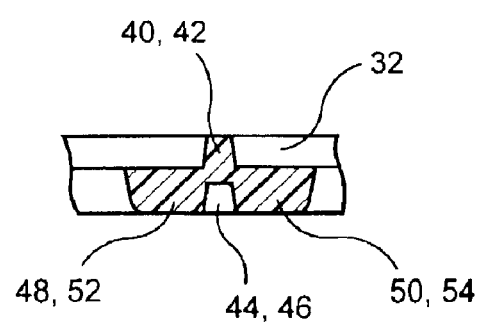
FIG. 23

STACKABLE TRAY FOR INTEGRATED CIRCUITS WITH CORNER SUPPORT ELEMENTS AND LATERAL SUPPORT ELEMENTS FORMING MATRIX TRAY CAPTURE SYSTEM

BACKGROUND OF THE INVENTION

1. Field of the Invention

The present invention relates to a tray for integrated circuits, particularly those of the ball grid array (BGA) type. The tray is stackable and includes an upper side and a lower side, wherein the upper and lower sides of successive trays form storage pocket areas therebetween. More particularly, one of the sides includes corner elements which define the periphery of the storage pockets and which restrain the integrated circuits in directions (X-Y) parallel to the floor of the tray. This side further includes lateral elements which extend into the storage pockets thereby forming a ledge to restrain the integrated circuits in the direction (Z) perpendicular to the floor of the tray. Another of the sides includes lateral elements which define the periphery of the storage pockets and which restrain the integrated circuits in directions (X-Y) parallel to the floor of the tray and further corner elements which extend into the storage pockets thereby forming an inverted ledge to restrain the integrated circuits in the direction (Z) perpendicular to the floor of the tray. These corner elements and lateral elements rise or erupt from the floor of the tray.

2. Description of the Prior Art

In the prior art, it is known to use stackable trays for the storage and transportation of integrated circuits, particularly ball grid array (BGA) integrated circuits. These stackable trays typically form discrete storage pockets for engaging individual chips. Moreover, these trays are sometimes used as a carrier to engage and position the chips for automated assembly apparatus. In this type of application, the use of lids separate from the trays makes the automated assembly process more difficult by adding steps to remove the separate lids.

Moreover, it is imperative that these stackable trays provide substantial mechanical and electrostatic/electromagnetic protection for the chips.

Some examples of the prior art stackable trays can be found in U.S. Pat. No. 5,400,904 entitled "Tray for Ball Terminal Integrated Circuits", issued to Maston et al. on Mar. 28, 1995; U.S. Pat. No. 5,103,976 entitled "Tray for Integrated Circuits with Supporting Ribs", issued to Murphy on Apr. 14, 1992; U.S. Pat. No. 5,080,228 entitled "Integral Carrier and System for Electrical Components", issued to Maston et al. on Jan. 14, 1992; U.S. Pat. No. 5,000,697 entitled "Carrier System for PGA Electrical Components", issued to Murphy on Mar. 19, 1991; U.S. Pat. No. 4,765,471 entitled "Electrical Component Carrier", issued to Murphy on Aug. 23, 1988.

OBJECTS AND SUMMARY OF THE INVENTION

It is therefore an object of the present invention to provide trays which can be stacked to provide storage pockets for electronic chips, such as, but not limited to, BGA (ball grid array) chips.

It is therefore a further object of the present invention to provide trays for the storage and transportation of electronic chips, wherein the trays provide improved mechanical, electrostatic and electromagnetic protection of the chips stored therewithin.

It is therefore a still further object of the present invention to provide trays for the storage and transportation of electronic chips, wherein the structures capturing and supporting the chips in directions (X-Y) parallel to floor of the tray are separate from and independent from the structures capturing and supporting the chips in the direction (Z) perpendicular to the floor of the tray.

It is therefore a still further object of the present invention to provide trays for the storage and transportation of electronic chips, wherein the structures defining the storage pockets are generally removed from the periphery of the trays.

It is therefore a still further object of the present invention to provide trays for the storage and transportation of electronic chips, wherein the storage pockets are formed and defined by the stacking of successive trays, with the need for any additional structural components to define the storage pockets, such as separate lids, reduced or eliminated.

It is therefore a still further object of the present invention to provide trays for the storage and transportation of electronic chips which achieve the above-identified objects while maintaining a simple shape which can be easily and inexpensively molded or otherwise manufactured.

These and other objects are attained by providing a tray which can be successively stacked with like trays to form storage pockets therebetween. A first side of the tray, such as the upper side, includes corner elements which extend from the floor of the tray and which define the corners of the storage pockets. The resulting width and length of the storage pockets as defined by the inner intersections of the corner elements are substantially equal to the width and length of the chips to be stored and transported therein. The first side further includes lateral elements which extend from the floor of the tray along the sides of the storage pockets. On this first side, the corner elements extend a greater distance from the floor of the tray than do the lateral elements. However, the lateral elements extend inwardly into the storage pocket so as to define a width or length between opposite lateral elements less than the width or length of the storage pocket as defined by the inner intersections of the corner elements. The resulting structure on the first side of the tray causes the corner elements to restrain the integrated circuits in directions parallel (X-Y) to the floor of the tray. The inward extension of the lateral elements into the storage pockets creates an inverted ledge which restrains the integrated circuits in the direction perpendicular (Z) to the floor of the tray.

A second side of the tray, such as the lower side of the tray, include corner elements which extend from the floor of the tray. The corner elements on the second side of the tray have inner intersections which define an area somewhat smaller, both in width and length, than the storage pocket as defined by the inner intersections of the corner elements on the first side of the tray. However, the lateral elements on the second side of the tray define an area which is coextensive with the area defined as the storage area by the corner elements on the first side of the tray. Moreover, on the second side of the tray, the lateral elements extend a greater distance from the floor of the tray than do the corner elements. The resulting structure on the second side of the tray causes the corner elements to create a ledge which restrains the integrated circuits in the direction (Z) perpendicular to the floor of the tray while the lateral elements on the second side of the tray restrain the integrated circuits in the directions (X-Y) parallel to the floor of the tray.

As the corner elements and lateral elements on both the first and second sides of the tray stand as independent elements from the floor or floor of the tray, no wall is utilized or required for the definition of the storage pockets.

DESCRIPTION OF THE DRAWINGS

Further objects and advantages of the invention will become apparent from the following description and claims, and from the accompanying drawings, wherein:

FIG. 1 is a perspective view of the upper side of the stacking tray of the present invention.

FIG. 2 is a perspective view of a detailed view of a corner portion of the upper side of the stacking tray of the present invention.

FIG. 9 is a side plan view of the stacking tray of the present invention.

FIG. 10 is a sectional view along plane 10—10 of FIG. 5.

FIG. 20 is a detailed plan view of a portion of FIG. 5, showing a portion of the upper side of the stacking tray which forms a storage pocket which is a closed cell for vacuum operations.

FIG. 21 is a sectional view along plane 21—21 of FIG. 20.

FIG. 22 is a detailed plan view of a portion of FIG. 5, showing a portion of the upper side of the stacking tray which forms a tongue for engagement with a groove on a corresponding portion of the lower side of the stacking tray.

FIG. 23 is a sectional view along plane 23—23 of FIG. 22.

FIG. 24 is a detailed plan view of the groove on a lower side of the stacking tray, for engagement with the tongue of FIGS. 22 and 23.

DETAILED DESCRIPTION OF THE PREFERRED EMBODIMENT

Figure 3:
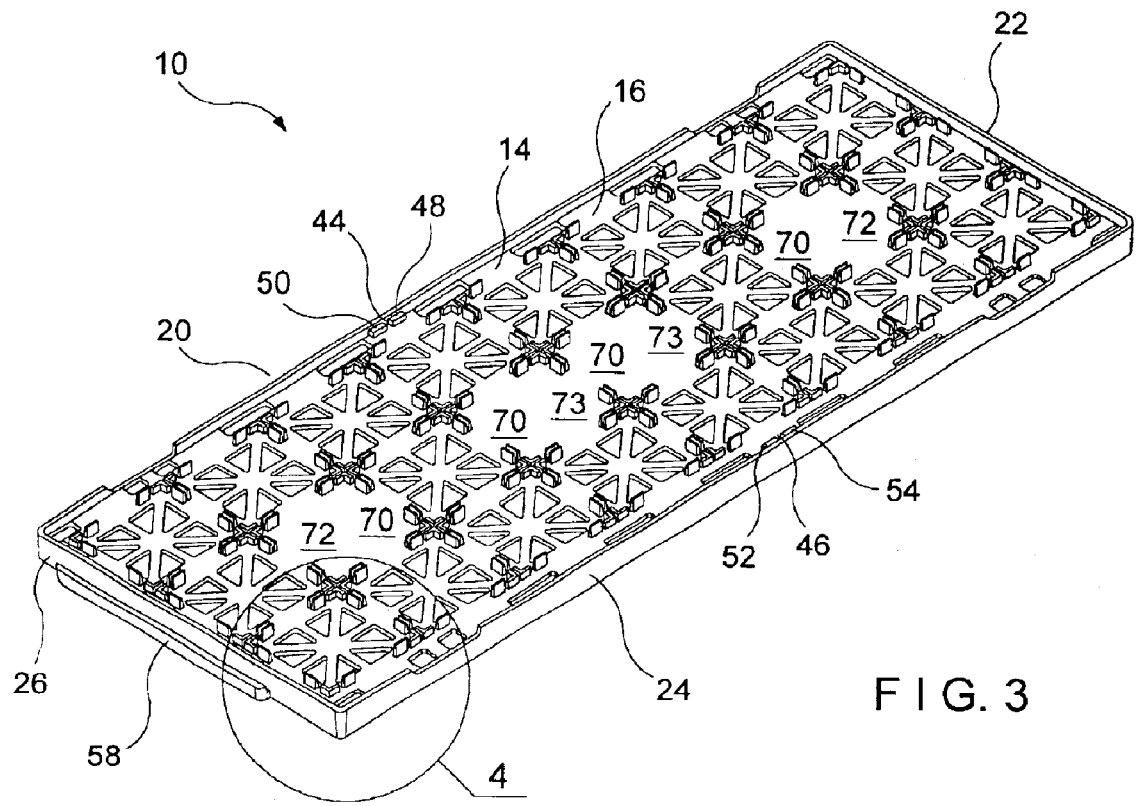
FIG. 3 is a perspective view of the lower side of the stacking tray of the present invention.
Figure 4:
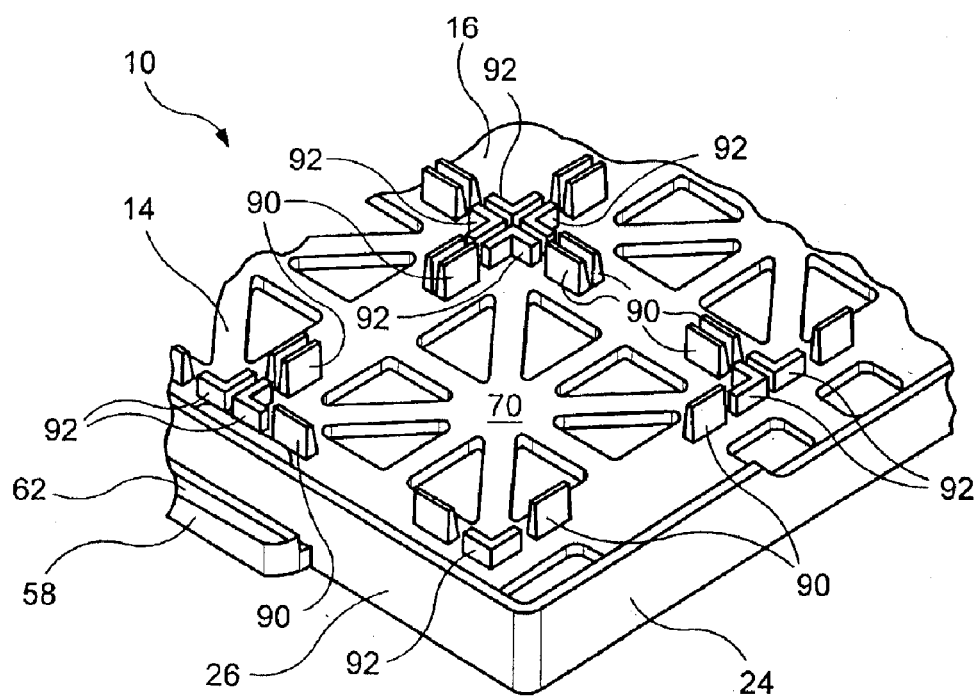
FIG. 4 is a perspective view of a detailed view of a corner portion of the lower side of the stacking tray of the present invention.
Figure 15:
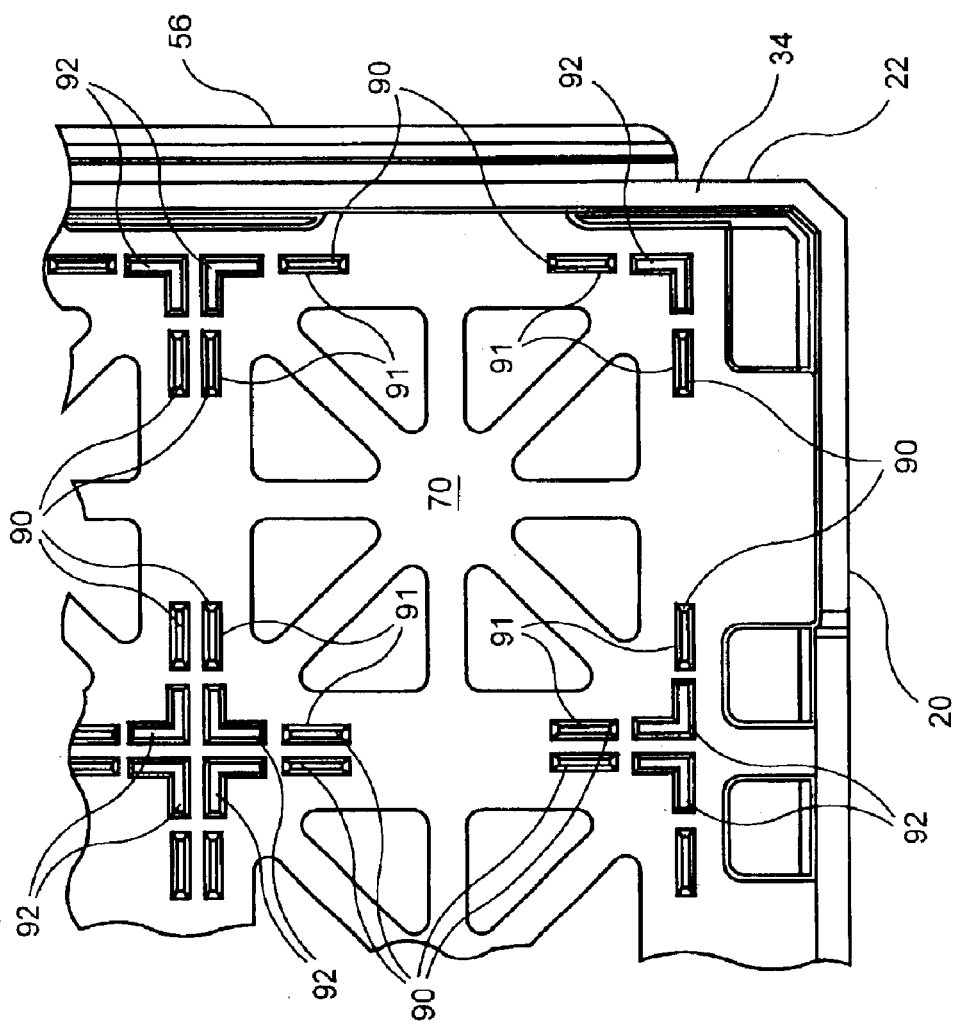
FIG. 15 is a detailed plan view of a corner of the lower side of the stacking tray of the present invention.
Figure 14:
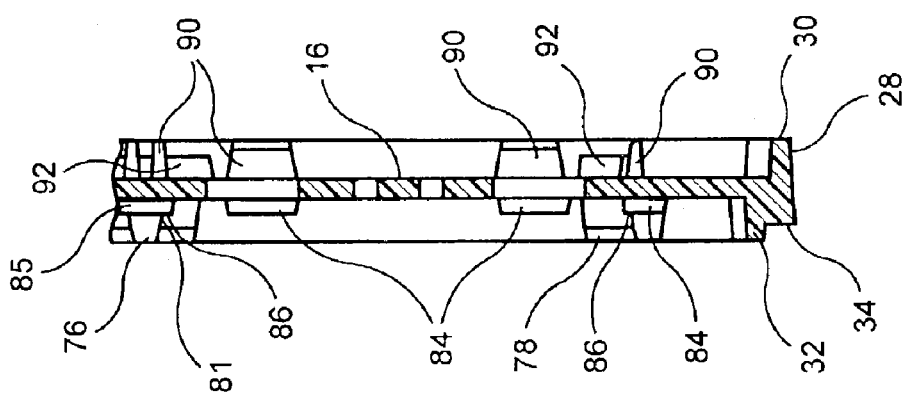
FIG. 14 is a sectional view along plane 14—14 of FIG. 13.
Figure 17:
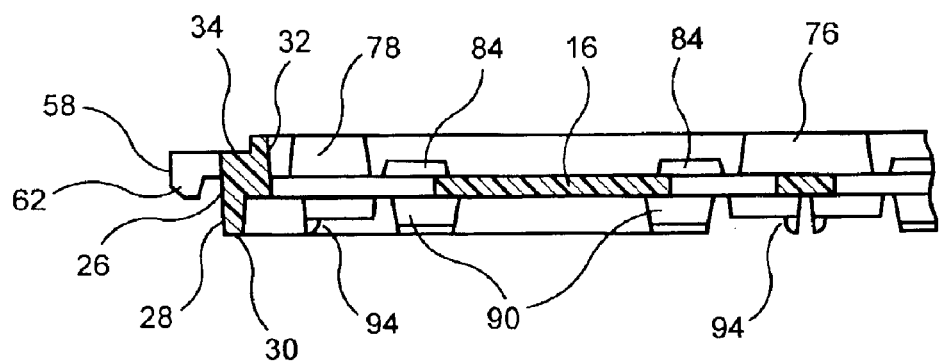
FIG. 17 is a sectional view along plane 17—17 of FIG. 13.
Figure 18:
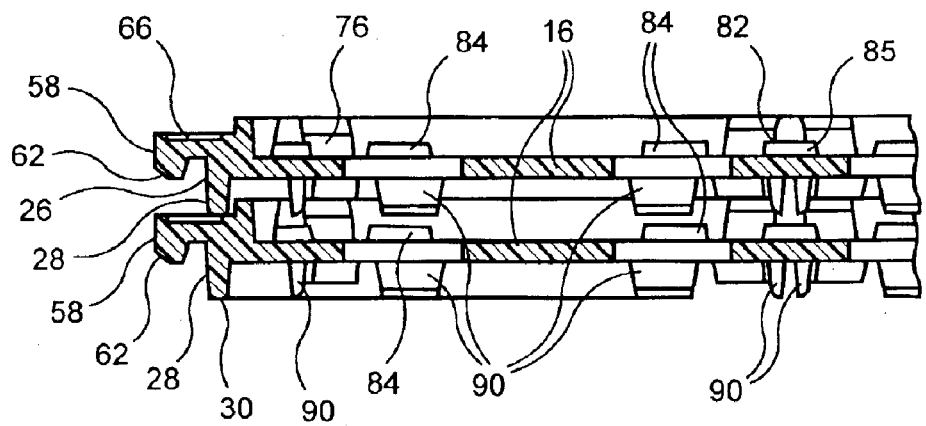
FIG. 18 is a sectional view of two stacked trays along plane 16—-16 of FIG. 13 thereby forming a storage pocket therebetween.

Referring now to the drawings in detail wherein like numerals indicate like elements throughout the several views, one sees that FIG. 1 is a perspective view the upper side 12 of stacking tray 10 while FIG. 3 is a perspective view of the lower side 14 of stacking tray 10. Upper side 12 of stacking tray 10 is further shown in FIGS. 2, 5 and 13 while lower side 14 of stacking tray 10 is further shown in FIGS. 4, 12 and 15.

In the embodiment shown, a three by eight configuration of chip storage pockets is formed by the stacking of successive identical or substantially identical trays 10. However, it should be clear to those skilled in the art that different numbers or configurations of storage pockets may be practiced by the present invention. Tray 10 is typically formed of molded plastic with high electrostatic and high electromagnetic resistance.

Figures 5, 6:
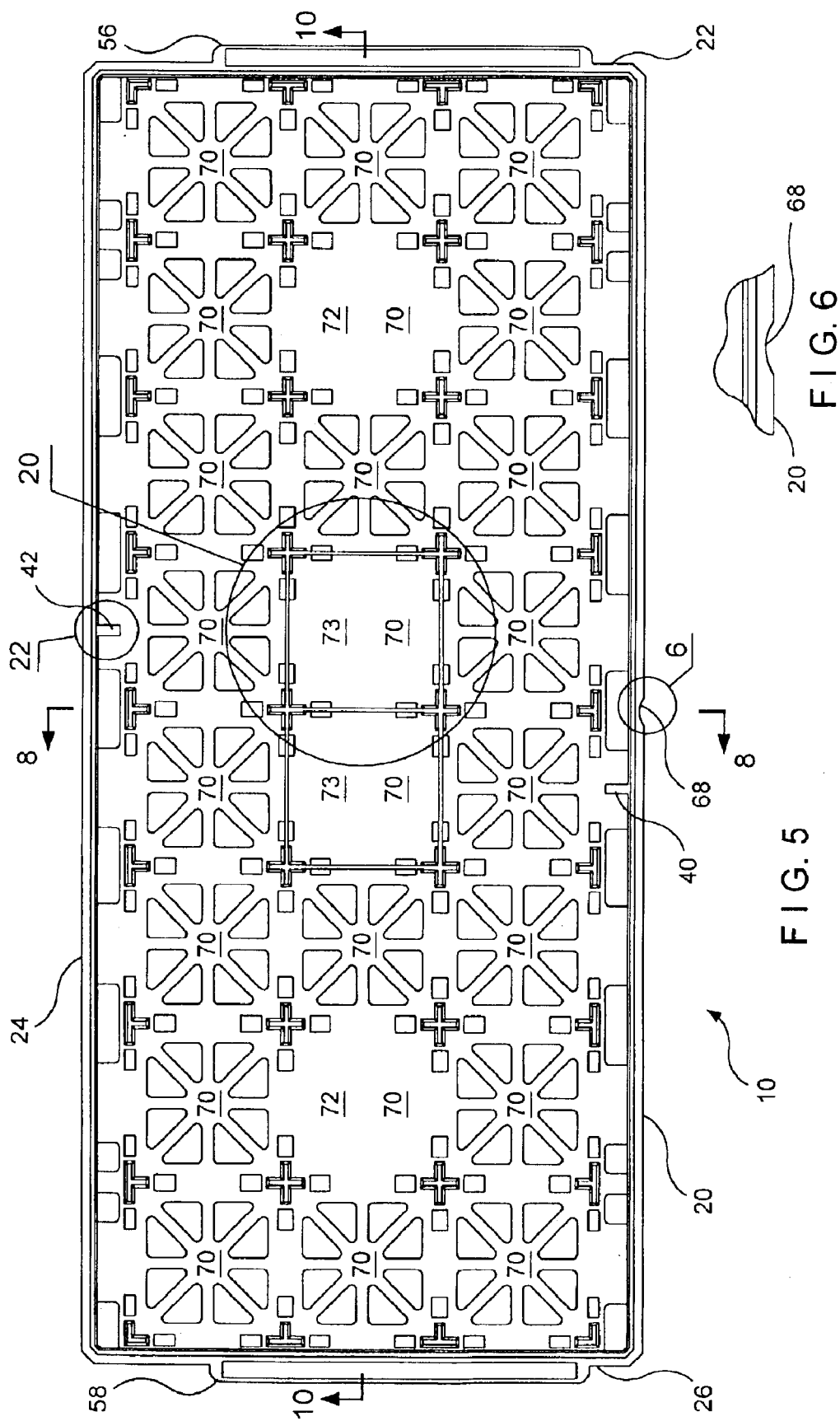
FIG. 5 is a plan view of the upper side of the stacking tray of the present invention.
FIG. 6 is a detailed plan view of an indentation on the side of the stacking tray of the present invention.
Figure 7:
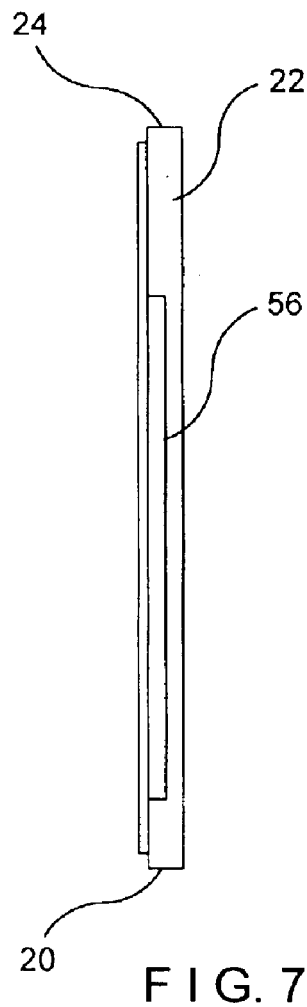
FIG. 7 is an end plan view of the stacking tray of the present invention.
Figure 8:
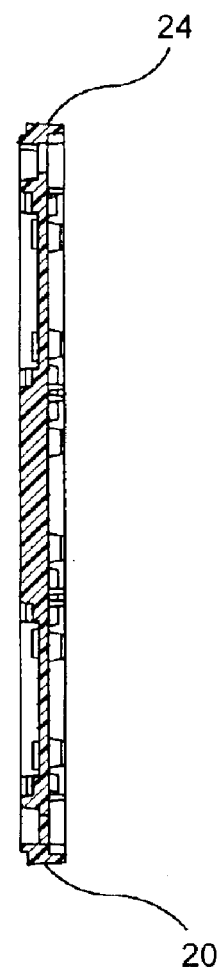
FIG. 8 is a sectional view along plane 8—8 of FIG. 5.
Figure 11:
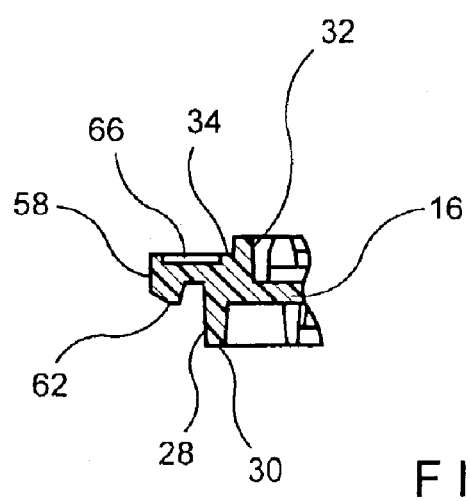
FIG. 11 is a sectional view detailing the end portion of the sectional view of FIG. 10.
Figure 12:
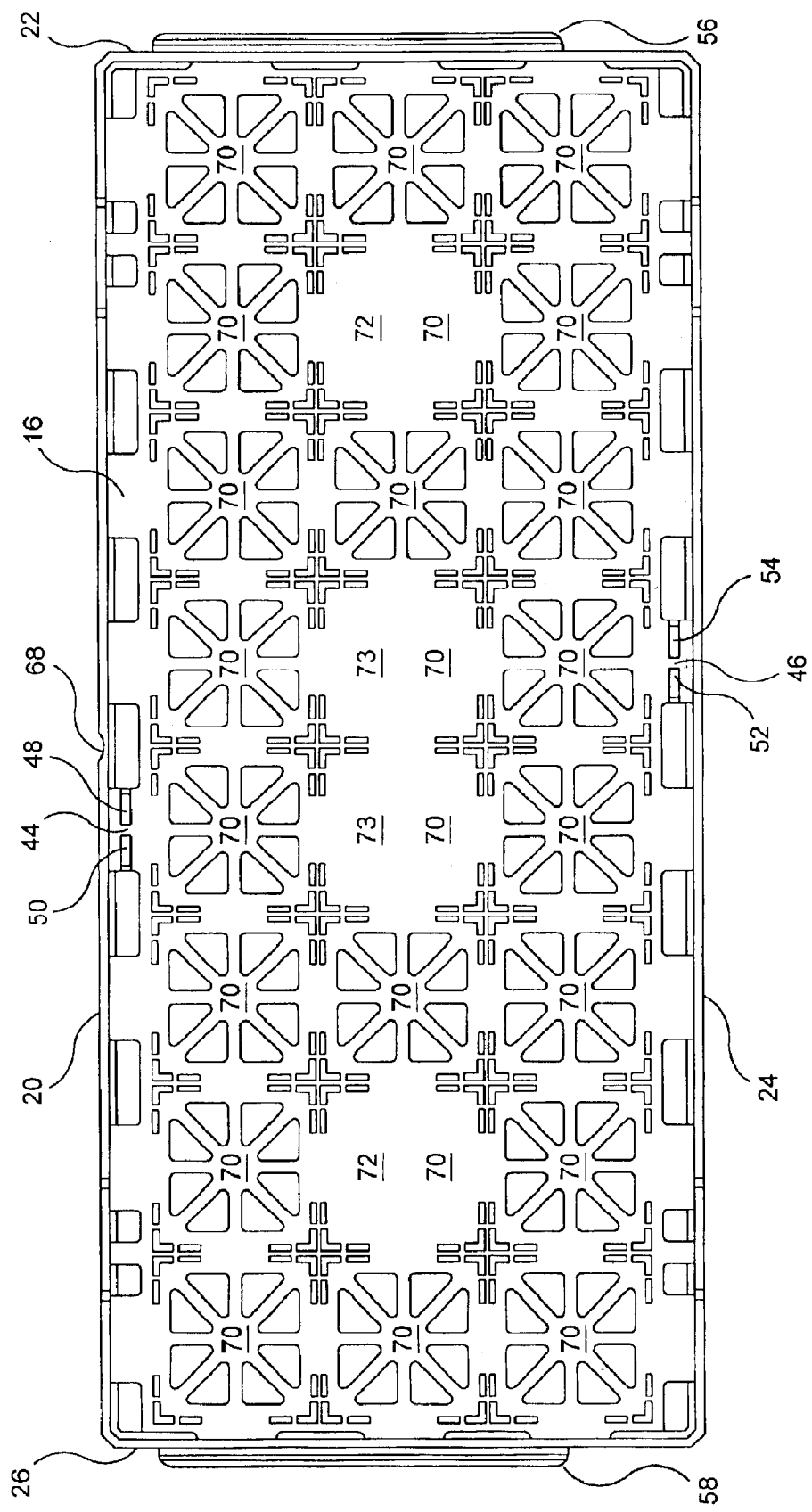
FIG. 12 is a plan view of the lower side of the stacking tray of the present invention.

Tray 10 includes a rectangular floor 16 bounded by long sides 20, 24 and short sides 22, 26. As shown in FIGS. 11, 14 and FIGS. 16–19, downwardly extending tapered support rim 28 extends downwardly along sides 20, 22, 24, 26 and terminates in surface 30. Likewise, upwardly extending support rim 32 extends upwardly along sides 20, 22, 24, 26 and includes peripherally notched seat 34 into which the surface 30 of a successive tray 10 stacked thereupon aligns and seats (see FIGS. 18 and 19 for the stacked configuration). Additionally, in order to align successive stacked trays 10, as shown in FIGS. 1 and 6, upper side 12 includes tongues 40, 42 protruding inwardly from upwardly extending support rim 32 at off-center positions on long sides 20, 24. As shown in FIGS. 3 and 12, grooves 44, 46 are formed between lands 48, 50 and 52, 54 which are formed on lower side 14 inwardly from downwardly extending tapered support rim 28 at off-center positions along long sides 20, 24. FIG. 22 shows tongue 40 or 42 in greater detail. FIG. 23 shows a cross-sectional view showing tongue 40 or 42 formed over groove 44 or 46 which is formed, in turn, by the space between lands 48, 50 or 52, 54. FIG. 24 shows groove 44 or 46. In the stacked configuration, tongues 40, 42 are engaged or seated within grooves 44, 46, respectively, of a successive higher stacked tray 10.

Short sides 22, 26 further include outwardly extending finger grips 56, 58, respectively. Finger grips 56, 58 include downwardly protruding lips 60, 62, and upper shallow grooves 64, 66, respectively; to aid in the manual handling of trays 10. As shown in FIGS. 1, 5 and 12, and in detail in FIG. 6, side 20 further includes indentation 68 at a relatively central location. Indentation 68 can be used as a thumbwell to manually position trays 10 during the stacking process.

As shown in FIGS. 1, 3, 6 and 12, three rows of eight integrated chip storage pockets 70 are formed within tray 10. Floor 16 typically includes interstices or passageways forming a lattice structure around storage pockets 70, but floor 16 in the second and seventh storage pockets in the interior row of storage pockets is solid so as to form vacuum cells 72. Similarly, the fourth and fifth storage pockets of the interior row of storage pockets has a solid floor 16 and lateral walls (described in more detail hereinafter) to form interior vacuum cells 73.

Figure 13:
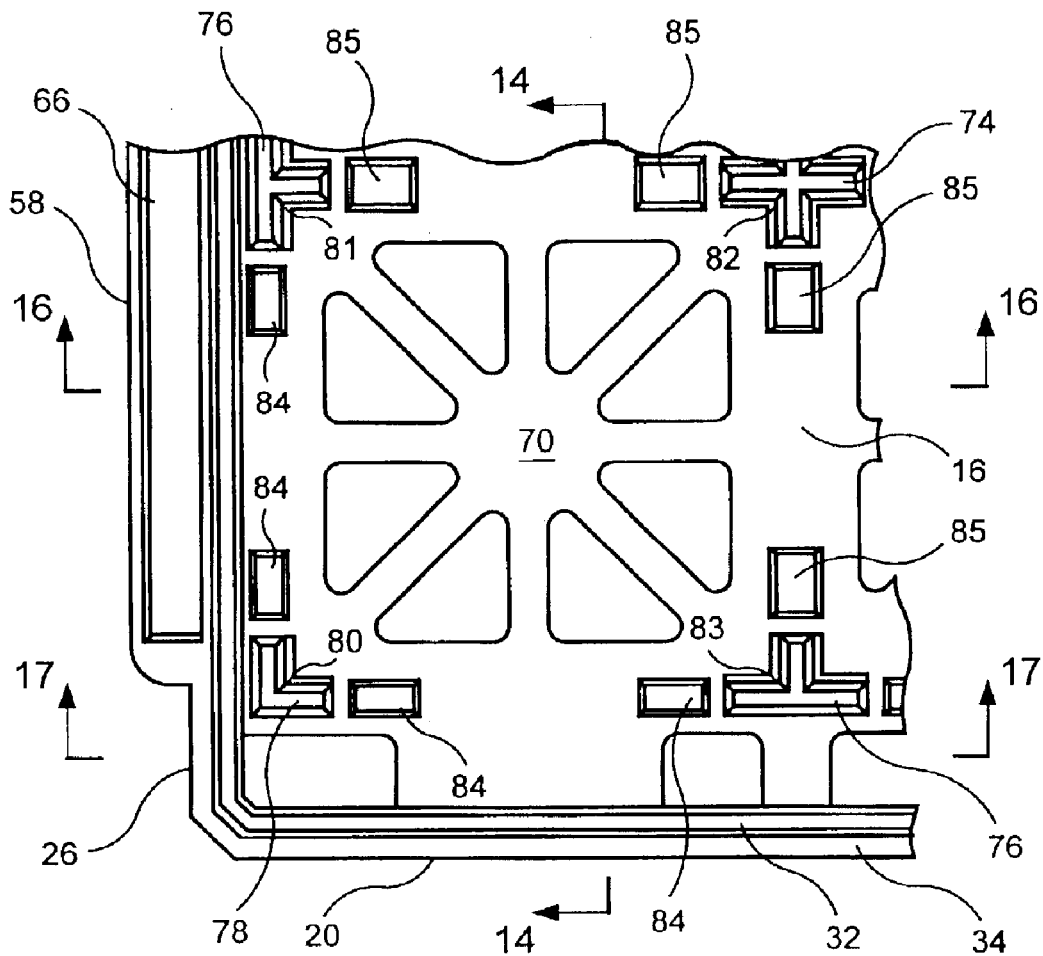
FIG. 13 is a detailed plan view of a corner of the upper side of the stacking tray of the present invention.
Figure 16:
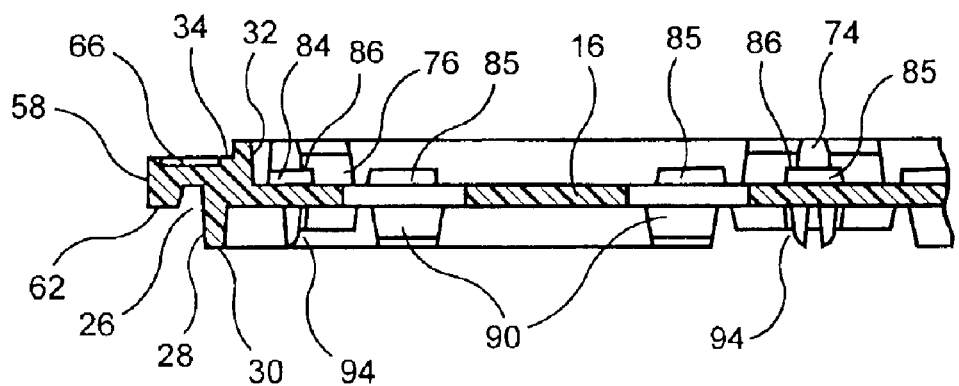
FIG. 16 is a sectional view along plane 16—16 of FIG. 13.

As shown in FIGS. 1, 2, 5 and 13, storage pockets 70 are defined by beveled corner elements 74, 76, 78 formed on the upper side 12 of floor 16 of stacking tray 10. X-shaped beveled corner elements 74 are formed within the interior of floor 16 at the intersection of four storage pockets 70. T-shaped beveled corner elements 76 are formed at the intersection of two storage pockets 70 along the sides 20, 22, 24, 26 but not at the corners of sides 20, 22, 24, 26. L-shaped beveled corner elements 78 are formed for a single storage pocket 70 at the corners of 20, 22, 24, 26. Referring now to FIG. 13, the rectangular shape or square shape defined by the inner intersections 80, 81, 82, 83 of the beveled corner elements 78, 76, 74, 76 is the dimension of the integrated chip 1000 to be stored within storage pocket 70. Therefore, the various beveled corner elements 74, 76, 78 abut the edges of the integrated circuit 1000 (see FIG. 19) thereby restraining the movement of chip 1000 in directions parallel to floor 12 of tray 10 (i.e., the X and Y directions). As shown in FIGS. 1, 2 and 16–18, lateral elements 84, 85 extend from upper side 12 of floor 16 at a lesser distance or height (Z direction) than do corner elements 74, 76, 78. Lateral elements 84 are formed inwardly adjacent from sides 20, 22, 24, 26 and extend into a single storage pocket 70 while lateral elements 85 are formed between adjacent storage pockets 70 and extend into both adjacent storage pockets 70. As shown in FIG. 13, the width of lateral elements 84, 85 extends in the directions parallel to floor 16 (X-Y directions) into the area defined as the storage pocket area by inner intersections 80, 81, 82, 83. This reduced height of lateral elements 84, 85 along with the width which extends into storage pocket 70 causes the portion of lateral elements 84, 85 which extend into the storage pocket 70 to form a ledge 86 (see FIGS. 14 and 16) to engage the edges of integrated circuit 1000 and restrain the movement of chip 1000 in the direction perpendicular to floor 16 (i.e., the Z direction). This structure results in the X-Y axis capture and support being separate from and independent from the Z axis capture and support.

As shown in FIGS. 3, 4, 12 and 15, beveled lateral elements 90 are formed on lower side 14 of stacking tray 10. The edges 91 (see FIG. 15) of beveled lateral elements 90 align with the edges of the storage pocket 70 as defined by the inner intersections 80, 81, 82, 83 of the corner elements of upper side 12 (see FIG. 13) of a successive stacking tray 10. These edges 91 of beveled lateral elements abut the edge of integrated chip 1000 to restrain movement of the chip in directions parallel to the floor 16 (i.e., the X-Y directions). The beveled lateral elements 90 of adjacent storage pockets 70 have a space or gap formed therebetween.

L-shaped corner elements 92 are formed on the lower side 14 of the floor 16 at the corners of the storage pockets 70. The beveled lateral elements 90 extend from the floor 16 at a greater distance (Z direction) than do L-shaped corner elements 92. Furthermore, the width L-shaped corner elements 92 extends in the directions parallel to floor 16 (X-Y directions) into the area defined as the storage pocket area by edges 91 of beveled lateral elements 90 (and likewise defined by inner intersections 80, 81, 82, 83 of upper side 12 as shown in FIG. 13). This reduced extent of L-shaped corner elements 92 along with the width of L-shaped corner elements 92 which extends into storage pocket 70 causes the portion of L-shaped corner elements 92 which extend into the storage pocket 70 to form an inverted ledge 94 (see FIGS. 16 and 17) to engage the edges of integrated circuit 1000 and restrain the movement of chip 1000 in the direction perpendicular to floor 16 (i.e., the Z direction). The L-shaped corner elements 92 of adjacent storage pockets 70 have a gap or space formed therebetween. As with the upper side 12, this structure results in the X-Y axis capture and support being separate from and independent from the Z axis capture and support.

As shown in FIGS. 1 and 5 and in more detail in FIGS. 20 and 21, the two center vacuum cells 73 are confined by walls 88 which extend between the legs of successive X-shaped beveled corner elements 74 and across lateral elements 85 about the periphery of center vacuum cell 73. In the engaged position, walls 88 are engaged between beveled lateral elements 90 of adjacent storage pockets as well as between L-shaped corner elements 92 of adjacent storage pockets.

Figure 19:
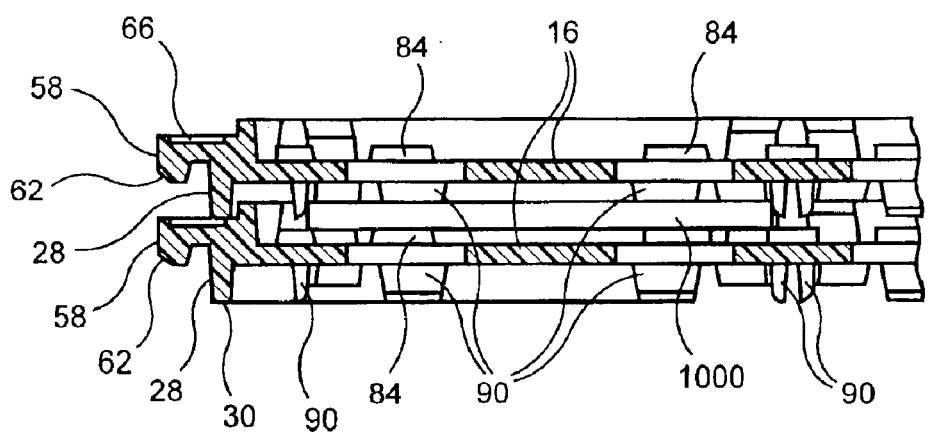
FIG. 19 is a sectional view of two stacked trays along plane 16-16 of FIG. 13 thereby forming a storage pocket therein, with an integrated chip shown supported by the various corner and lateral elements.

FIG. 19 illustrates two stacked trays 10 with a storage pocket 70 formed therebetween with an integrated chip 1000 engaged therewithin.

Thus the several aforementioned objects and advantages are most effectively attained. Although preferred embodiments of the invention have been disclosed and described in detail herein, it should be understood that this invention is in no sense limited thereby and its scope is to be determined by that of the appended claims.

What is claimed is:

1. A tray for storage of electrical components, which is successively stackable with like trays, said tray including:
    a floor including a first side and a second side;
    a rim extending around said tray, wherein portions of said rim extending from said first side mate with portions of said rim extending from said second side of a successive like tray;
    said first side including a plurality of first corner elements, said first corner elements including internal intersections which define peripheries of storage pockets for an electrical component;
    said first side further including first lateral elements along sides of said peripheries of said storage pockets, said first lateral elements extending across said peripheries into said storage pockets;
    said first corner elements extending from said floor a first distance and said first lateral elements extending from said floor a second distance, wherein said first distance is greater than said second distance;
    said second side including a plurality of second corner elements which are formed along corners of said peripheries of said storage pockets, said second corner elements extending across said peripheries into said storage pockets;
    said second side including a plurality of second lateral elements with edges which align with said peripheries of said storage pockets; and
    said second lateral elements extending from said floor a third distance and said second corner elements extending from said floor a fourth distance, wherein said third distance is greater than said fourth distance;
    wherein said storage pockets are square or rectangular, are defined by four inner intersections of said first corner elements, and are formed between said first side of the tray and said second side of a successive like tray;
    wherein the tray includes a plurality of rows, each of said rows including a plurality of storage pockets;
    wherein said first and second corner elements and said first and second lateral elements are spaced apart from and free of contact with said rim;
    wherein portions of said first lateral elements extending into said storage pockets form a first ledge to engage the electrical components, said first lateral elements thereby supporting the electrical components in a direction perpendicular to said floor; and
    wherein portions of said second corner elements extending into said storage pockets form a second ledge to engage the electrical components, said second corner elements thereby supporting the electrical components in a direction perpendicular to said floor.

2. The tray of claim 1 wherein said first corner elements abut edges of the electrical components, said first corner elements thereby supporting the electrical components in directions parallel to said floor.

3. The tray of clam 2 wherein said second lateral elements abut edges of the electrical components, said second lateral elements thereby supporting the electrical components in directions parallel to said floor.

4. The tray of claim 3 wherein said first corner elements and said second lateral elements are beveled.

5. The tray of claim 4 wherein said first lateral elements have a rectangular cross section.

6. The tray of claim 5 wherein said second corner elements have a cross section formed by two rectangular elements a right angle to each other.

7. The tray of claim 6 wherein said first side includes a first of a tongue and a groove, and said second side includes a second of a tongue and a groove, wherein said tongue and groove engage when the tray is stacked with a successive like tray thereby aligning and securing the tray with the successive like tray.

8. The tray of claim 7 wherein portions of said floor facing at least a portion of said storage pockets have passageways therethrough.

9. The tray of claim 8 wherein said floor is solid throughout an area facing at least one of said storage pockets.

10. The tray of claim 9 wherein said at least one storage pocket with a solid floor facing thereto further includes walls formed between the first corner elements defining said at least one storage pocket, thereby creating a vacuum cell as a storage pocket.

11. The tray of claim 10 wherein said first corner elements are L-shaped at locations adjacent to corners of said floor, T-shaped at locations adjacent to said rim but removed from said corners, and X-shaped at interior locations removed from said rim.

12. The tray of claim 11 wherein said second corner elements of adjacent storage elements have a gap formed therebetween and wherein said second lateral elements of adjacent storage elements have a space formed therebetween.

13. The tray of claim 1 wherein said first lateral elements are separate from and independent from said first corner elements and wherein said second lateral elements are separate from and independent from said second corner elements.

\* \* \* \* \*